(12) United States Patent
Alpert et al.

(10) Patent No.: US 6,671,867 B2
(45) Date of Patent: Dec. 30, 2003

(54) ANALYTICAL CONSTRAINT GENERATION FOR CUT-BASED GLOBAL PLACEMENT

(75) Inventors: Charles J. Alpert, Austin, TX (US); Gi-Joon Nam, Austin, TX (US); Paul G. Villarrubia, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/121,877

(22) Filed: Apr. 11, 2002

(65) Prior Publication Data

US 2003/0196183 A1 Oct. 16, 2003

(51) Int. Cl.[7] .................................................. G06F 9/45
(52) U.S. Cl. .................................. 716/10; 716/8; 716/9
(58) Field of Search ................................ 716/1, 8, 2, 9, 716/10, 11, 16, 18, 17, 7, 12

(56) References Cited

U.S. PATENT DOCUMENTS

| | | | | |
|---|---|---|---|---|
| 5,521,837 A | * | 5/1996 | Frankle et al. | 716/10 |
| 5,682,321 A | * | 10/1997 | Ding et al. | 716/8 |
| 6,301,693 B1 | * | 10/2001 | Naylor et al. | 716/10 |
| 6,389,582 B1 | * | 5/2002 | Valainis et al. | 716/9 |
| 6,480,991 B1 | * | 11/2002 | Cho et al. | 716/8 |

* cited by examiner

*Primary Examiner*—Vuthe Siek
*Assistant Examiner*—Binh C. Tat
(74) *Attorney, Agent, or Firm*—Casimer K. Salys; Jack V. Musgrove

(57) ABSTRACT

A method of designing the layout of an integrated circuit (IC) by deriving an analytical constraint for a cut-based placement partitioner using analytical optimization, and placing cells on the IC with the cut-based placement partitioner using the analytical constraint. Quadratic optimization may be used to determine a desired ratio of a cell area of a given partition to a total cell area (the balance parameter), and placing may be performed using multilevel bisection partitioning constrained by the balance parameter. This implementation may include a determination of an aspect ratio for an entire partitioning region of the integrated circuit, and a "center-of-mass" coordinate of the cells based on the quadratic optimization, which are then used to define a placement rectangle having the same aspect ratio, and centered on the center-of-mass coordinate. This placement rectangle is used to derive the balance parameter. The placement rectangle has a total area equal to a total moveable cell area, and the balance parameter is computed by calculating the ratio of a left portion of the placement rectangle which lies in the left partition to the total area of the placement rectangle. The multilevel partitioner then places a proportionate number of the cells in the left partition based on the balance parameter.

21 Claims, 5 Drawing Sheets

ANALYTICAL CONSTRAINT GENERATION FOR CUT-BASED GLOBAL PLACEMENT

BACKGROUND OF THE INVENTION

1. Field of the Invention

The present invention generally relates to the fabrication and design of semiconductor chips and integrated circuits, and more particularly to a method of designing the physical layout (placement) of logic cells in an integrated circuit, and the wiring (routing) of those cells.

2. Description of the Related Art

Integrated circuits are used for a wide variety of electronic applications, from simple devices such as wristwatches, to the most complex computer systems. A microelectronic integrated circuit (IC) chip can generally be thought of as a collection of logic cells with electrical interconnections between the cells, formed on a semiconductor substrate (e.g., silicon). An IC may include a very large number of cells and require complicated connections between the cells. A cell is a group of one or more circuit elements such as transistors, capacitors, resistors, inductors, and other basic circuit elements grouped to perform a logic function. Cells types include, for example, core cells, scan cells and input/output (I/O) cells. Each of the cells of an IC may have one or more pins, each of which in turn may be connected to one or more other pins of the IC by wires. The wires connecting the pins of the IC are also formed on the surface of the chip. For more complex designs, there are typically at least four distinct layers of conducting media available for routing, such as a polysilicon layer and three metal layers (metal-1, metal-2, and metal-3). The polysilicon layer, metal-1, metal-2, and metal-3 are all used for vertical and/or horizontal routing.

An IC chip is fabricated by first conceiving the logical circuit description, and then converting that logical description into a physical description, or geometric layout. This process is usually carried out using a "netlist," which is a record of all of the nets, or interconnections, between the cell pins. A layout typically consists of a set of planar geometric shapes in several layers. The layout is then checked to ensure that it meets all of the design requirements, particularly timing requirements. The result is a set of design files known as an intermediate form that describes the layout. The design files are then converted into pattern generator files that are used to produce patterns called masks by an optical or electron beam pattern generator. During fabrication, these masks are used to pattern a silicon wafer using a sequence of photolithographic steps. The component formation requires very exacting details about geometric patterns and separation between them. The process of converting the specifications of an electrical circuit into a layout is called the physical design.

The present invention is directed to an improved method for designing the physical layout (placement) and wiring (routing) of cells. Cell placement in semiconductor fabrication involves a determination of where particular cells should optimally (or near-optimally) be located on the surface of a integrated circuit device. Due to the large number of components and the details required by the fabrication process, physical design is not practical without the aid of computers. As a result, most phases of physical design extensively use computer aided design (CAD) tools, and many phases have already been partially or fully automated. Automation of the physical design process has increased the level of integration, reduced turn around time and enhanced chip performance.

A few years ago, pure standard cell designs could be considered the norm, but today's "chunky" designs contain large blocks of reserved areas for memory arrays, proprietary (IP) blocks, etc. Consequently, placement now resembles the problem of arranging "dust" logic around these large blocks. Since the large blocks tend to dictate the design footprint, one can no longer assume that the placeable area in some way matches the total cell area of the design; indeed, there is a marked trend of increasing percentage of free space available on the chip. One might think increased free space, or "design sparsity", would make placement easier. However, even though the dust logic is a small percentage of the chip area, there can still be millions of cells in the dust logic that have profound effects on timing and routability.

Placement algorithms are typically based on either a simulated annealing, top-down cut-based partitioning, or analytical paradigm (or some combination thereof). Recent years have seen the emergence of several new academic placement tools, especially in the top-down partitioning and analytical domains. The advent of multilevel partitioning as a fast and extremely effective algorithm for min-cut partitioning has helped spawn a new generation of top-down cut-based placers. A placer in this class partitions the cells into either two (bisection) or four (quadrisection) regions of the chip, then recursively partitions each region until a global coarse placement is achieved. Such recursive cut-based placement can perform quite well when designs are dense, but they perform rather poorly when the designs are sparse. Sparse designs tend to fool the partitioner since it does not know how to handle the large flexibility in the balance tolerance.

Analytical placers typically solve a relaxed placement formulation (such as minimizing total quadratic wirelength) optimally, allowing cells to temporarily overlap. Legalization is achieved by removing overlaps via either partitioning or by introducing additional forces and/or constraints to generate a new optimization problem. The classic analytical placers, PROUD and GORDIAN, both iteratively use bipartitioning techniques to remove overlaps. The PROUD placer is discussed in the article by R.-S. Tsay, E. S. Kuh, and C.-P. Hsu, "PROUD: A Fast Sea-of-Gates Placement Algorithm", Proc. 25th IEEE/ACM Design Automation Conference, pp. 318–323 (1988). The GORDIAN placer is discussed in the article by J. Kleinhaus, G. Sigl, F. Johannes and K. Antreich, "GORDIAN: VLSI Placement by Quadratic Programming and Slicing Optimization," IEEE Trans. on Computer-Aided Design, 10(3), pp. 356–365 (1991).

Analytical placers can perform poorly when the data is naturally degenerate (which occurs when few objects are fixed to I/O ports) since it becomes difficult to legalize a placement where thousands of cells have virtually the same location. Also, analytic methods may have difficulties in dense designs where legalization is forced to significantly alter the analytic solution.

Finally, cut-based partitioners can suffer from their inability to see the global picture. FIGS. 1A–1C show a simplified example with three cells A, B and C, and one potential unit (chip) of free space. Using a conventional multilevel partitioning algorithm, the first partitioning assigns one cell A to one side, and two cells B and C to the other side. The minimum cut (min-cut) solution, i.e., minimizing the number of wires that cross, results in the placement shown in FIG. 1A. This placement is adequate, but has more total wirelength than the preferred solution shown in FIG. 1B (which has a slightly higher net cut). An analytical solver does no better, and would place all three cells to the left of the cut-line, as shown in FIG. 1C (the overlap of the cells maybe adjusted by any one of several legalization methods).

In light of the foregoing, it would be desirable to devise an improved method of designing integrated circuits which could yield placements that are more efficient (compact), having reduced total wirelengths while maintaining relatively low net cuts. A more compact distribution leads to better timing and overall performance, and additionally reduces design time, and time to market. It would be further advantageous if the method could utilize the strength of analytical placers on sparse designs to improve the poor performance of cut-based placers.

SUMMARY OF THE INVENTION

It is therefore one object of the present invention to provide an improved method of designing integrated circuits.

It is another object of the present invention to provide an improved method of placing and routing cells on an integrated circuit.

It is yet another object of the present invention to provide a method of designing the physical layout of an integrated circuit which uses an analytical engine to improve the performance of a cut-based placer.

The foregoing objects are achieved in a method of designing a layout of an integrated circuit, generally comprising the steps of deriving an analytical constraint for a cut-based placement partitioner using analytical optimization, and placing cells on an integrated circuit with the cut-based placement partitioner using the analytical constraint. In the illustrative implementation, quadratic optimization is used to determine a desired ratio of a cell area of a given partition, e.g., the left partition, to a total cell area (the balance parameter), and placing is performed using multilevel bisection partitioning constrained by the balance parameter.

More specifically, this implementation involves determining an aspect ratio for an entire partitioning region of the integrated circuit, determining a "center-of-mass" coordinate of the cells based on the quadratic optimization, and defining a placement rectangle having the same aspect ratio, and centered on the center-of-mass coordinate. This placement rectangle is then used to derive the balance parameter. The placement rectangle has a total area equal to a total moveable cell area, and the balance parameter is computed by calculating the ratio of the left portion of the placement rectangle which lies in the left partition to the total area of the placement rectangle. The multilevel partitioner then places a number of cells in the left partition based on the balance parameter.

The above as well as additional objectives, features, and advantages of the present invention will become apparent in the following detailed written description.

BRIEF DESCRIPTION OF THE DRAWINGS

The present invention may be better understood, and its numerous objects, features, and advantages made apparent to those skilled in the art by referencing the accompanying drawings.

DESCRIPTION OF THE PREFERRED EMBODIMENT(S)

Figure 1A:
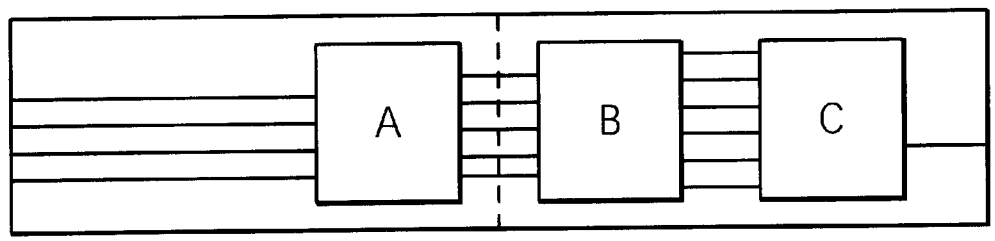
FIG. 1A is a pictorial representation of the assignment of three cells to different locations according to a conventional cut-based partitioning method for placing cells on an integrated circuit.
Figure 1B:
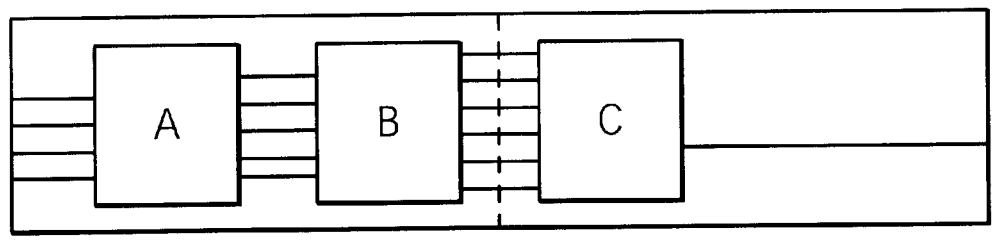
FIG. 1B is a pictorial representation of the assignment of the same three cells of FIG. 1A according to a preferred layout which has less total wirelength.
Figure 1C:
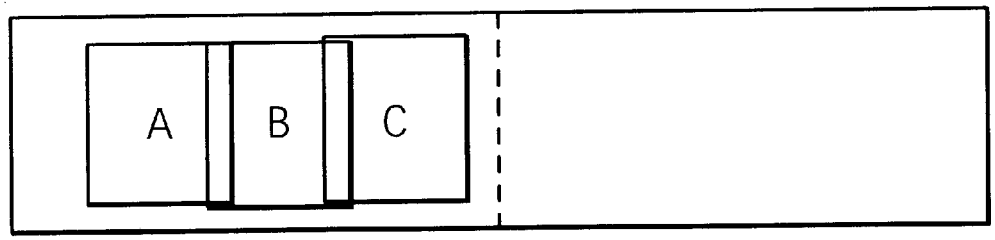
FIG. 1C is a pictorial representation of the assignment of the same three cells of FIGS. 1A and 1B according to a conventional analytical placement method wherein cells may temporarily overlap prior to legalization.
Figure 2:
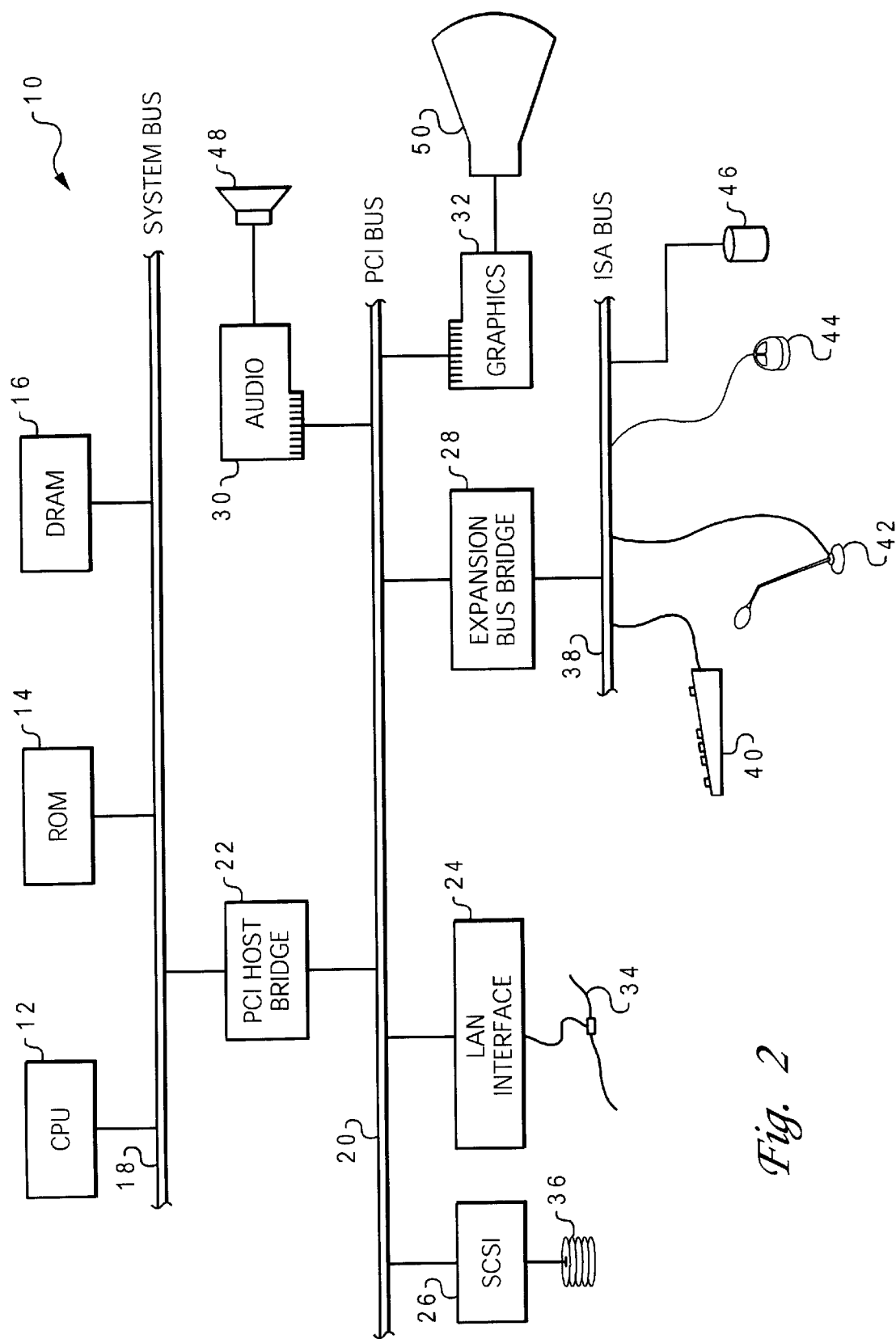
FIG. 2 is a block diagram of a computer system programmed to carry out computer-aided design of an integrated circuit in accordance with one implementation of the present invention.

With reference now to the figures, and in particular with reference to FIG. 2, there is depicted one embodiment 10 of a computer system programmed to carry out computer-aided design of an integrated circuit in accordance with one implementation of the present invention. System 10 includes a central processing unit (CPU) 12 which carries out program instructions, firmware or read-only memory (ROM) 14 which stores the system's basic input/output logic, and a dynamic random access memory (DRAM) 16 which temporarily stores program instructions and operand data used by CPU 12. CPU 12, ROM 14 and DRAM 16 are all connected to a system bus 18. There maybe additional structures in the memory hierarchy which are not depicted, such as on-board (L1) and second-level (L2) caches.

CPU 12, ROM 14 and DRAM 16 are also coupled to a peripheral component interconnect (PCI) local bus 20 using a PCI host bridge 22. PCI host bridge 22 provides a low latency path through which processor 12 may access PCI devices mapped anywhere within bus memory or I/O address spaces. PCI host bridge 22 also provides a high bandwidth path to allow the PCI devices to access DRAM 16. Attached to PCI local bus 20 are a local area network (LAN) adapter 24, a small computer system interface (SCSI) adapter 26, an expansion bus bridge 28, an audio adapter 30, and a graphics adapter 32. LAN adapter 24 may be used to connect computer system 10 to an external computer network 34, such as the Internet. A small computer system interface (SCSI) adapter 26 is used to control high-speed SCSI disk drive 36. Disk drive 36 stores the program instructions and data in a more permanent state, including the program which embodies the present invention as explained further below. Expansion bus bridge 28 is used to couple an industry standard architecture (ISA) expansion bus 38 to PCI local bus 20. As shown, several user input devices are connected to ISA bus 38, including a keyboard 40, a microphone 42, and a graphical pointing device (mouse) 44. Other devices may also be attached to ISA bus 38, such as a CD-ROM drive 46. Audio adapter 30 controls audio output to a speaker 48, and graphics adapter 32 controls visual output to a display monitor 50, to allow the user to carry out the integrated circuit design as taught herein.

While the illustrative implementation provides the program instructions embodying the present invention on disk drive 36, those skilled in the art will appreciate that the invention can be embodied in a program product utilizing other computer-readable media, including transmission media.

Computer system 10 carries out program instructions for placement of cells in the design of an integrated circuit, using a novel technique wherein an analytical engine determines constraints for a partitioner, such as a cut-based recursive gobal wiring placement system. Accordingly, the program may include conventional aspects of various analytical engines and cut-based partitioners, and these details will become apparent to those skilled in the art upon reference to this disclosure. In the exemplary embodiment, computer system 10 is programmed to use a quadratic optimization for determining the constraints, which are then applied to a multilevel partitioner. This analytical constraint generation (ACG) has the effect of using the quadratic solver to guide the multilevel partitioning into finding a natural distribution of cells into regions.

To understand the ACG algorithm in the illustrative implementation, it is helpful to briefly review cut-based partitioning and the analytic (quadratic) optimization. A cut-based partitioner generally performs recursive dissection. The present invention can more specifically be used with a multilevel partitioner which performs recursive bisection by dividing the number of available cells into two regions. These regions are then further partitioned iteratively until there is only one cell in each region. This implementation is only one of many types of partitioners which may be used; for example, the invention is not limited to bisection, as quadrisection partitioning can also be used. Other kinds of partitioning which may be used to carry out the present invention include, without limitation, flat partitioning, network flow placement, and spectral techniques using eigenvectors.

In analytical placement with a quadratic wirelength objective, one first solves the optimization problem:

$$\phi(x) = \Sigma a_{ij}(x_i - x_j)^2 \text{(for } i > j\text{)}$$

where $x = [x_1, x_2, \ldots, x_n]$ are the coordinates of the cells and ad is the weight of the net connecting cell i to cell j. This problem can be optimally solved with techniques such as successive-over relaxation or conjugate gradient methods.

In the illustrative implementation, the present invention uses the concept of a "balance parameter" in conjunction with this quadratic optimization. The balance parameter $\lambda$ ($0 \leq \lambda \leq 1$) is the desired ratio of the cell area of a given partition (e.g., the left partition in a bisection) to the total cell area. The present invention provides a methodology for determining a preferential value of the balance parameter, which is then applied to the multilevel partitioner. Partitioners can have a balance tolerance ($\Delta$) that specifies the amount of deviation that the partitioner is allowed to have from $\lambda$. In accordance with this implementation, the balance tolerance is set to zero, and then an appropriate value of $\lambda$ is determined.

Figure 3A:
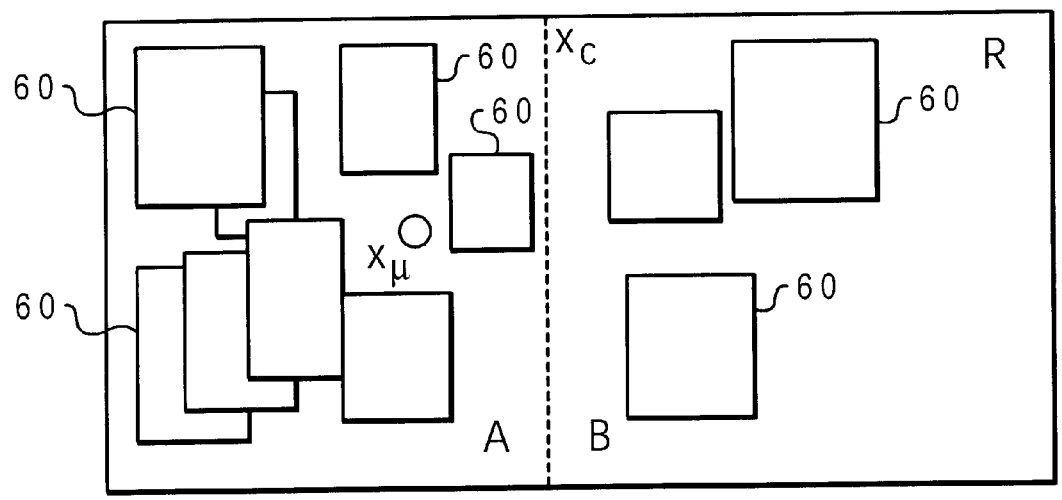
FIG. 3A is a simplified example of a layout of cells on an integrated circuit according to a quadratic optimization used by the present invention to derive a balance parameter for further partitioning.
Figure 3B:
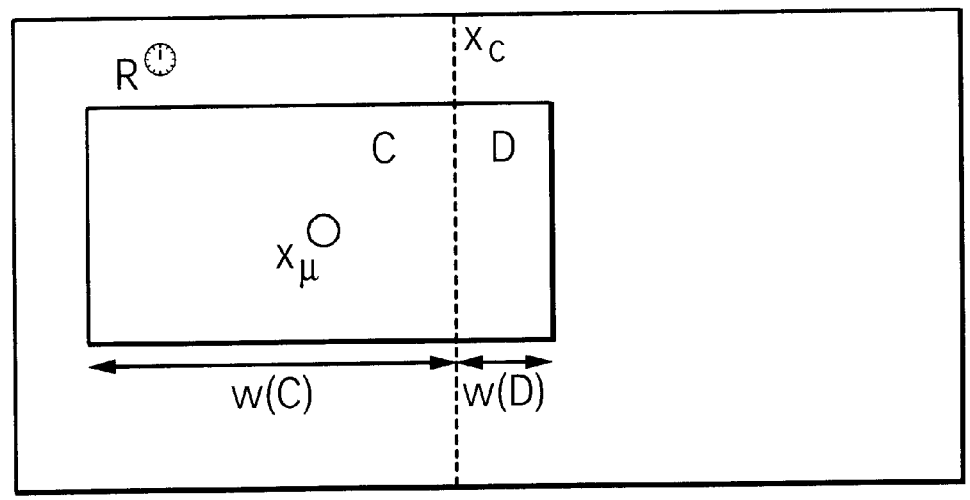
FIG. 3B is a pictorial representation of a method of deriving a balance parameter for a partition, using a "center-of-mass" of the quadratic solution of FIG. 3A.

A more specific example of the-present invention is shown in FIGS. 3A and 3B. FIG. 3A is a simplified integrated circuit layout based on a cell distribution derived from the quadratic optimization, wherein a majority of the cells lie significantly to the left of the cut line (with coordinate $x_c$), which divides the rectangle of the available integrated circuit layer. The cells 60 are to be partitioned into two rectangular regions A and B based on the cut line. The solution $x = [x_1, x_2, \ldots, x_n]$ of the squared wirelength optimization is used to choose the balance parameter for the two regions. A "center-of-mass" of the solution can be defined as:

$$x_\mu = (1/n)\Sigma a_i x_i \text{(for } i=1 \text{ to } n\text{)}$$

where n is the number of cells, and $a_i$ is the area of a given cell i. This center-of-mass $x_\mu$ is illustrated as a small dot in FIG. 3A, and is used to define the center of a new rectangle R as shown in FIG. 3B. The new rectangle R has the same aspect ratio as that of the rectangle of the available integrated circuit (i.e., the entire partitioning region), but has an area equal to the total moveable cell area $\alpha$. Thus, the height h(R) and width w(R) of this new rectangle are given by the equations:

$$h(R) = \sqrt{\frac{\alpha \cdot h(A)}{w(A) + w(B)}} \text{ and } w(R) = \sqrt{\frac{\alpha(w(A) \cdot w(B))}{h(A)}}$$

where h(A) is the height of region A, w(A) is the width of region A, and w(B) is the width of region B.

As noted, the center of this new rectangle R is the center-of-mass $x_\mu$. Since this point lies significantly to the left of the cut-line, the cut line now divides the new rectangle into two unbalanced portions. The relative areas of these two portions are used to compute the balance parameter $\lambda$. The ratio of the area of portion C to the area of rectangle R is equal to the ratio of their respective widths w(C) and w(R), since both C and R have the same height. It can be shown that this ratio can be expressed as:

$$\lambda = \frac{1}{2} + (x_c - x_\mu)/w(R).$$

This value is then used by the multilevel partitioner to assign the proportionate number cells to either region A or B. The result is a tightly packed layout. Tighter packing can make routing more difficult; in order to avoid such difficulties, this technique is not as dense as it might otherwise be. The density may be appropriately adjusted during the detailed placement step of the layout which follows.

The designer may come across two special cases which require further consideration. First, if $x_\mu$ is extremely far to the left or right side, then the value of $\lambda$ would be outside the acceptable range. So, if $\lambda < 0$, it is set to zero (i.e., all cells are assigned to the right partition), and if $\lambda > 1$, it is set to one (i.e., all cells are assigned to the left partition). Second, the condition might arise that either a(C)>a(A) or a(D)>a(B), in which case the partitioned cells will overflow one of the regions. In such a case, the rectangle R is moved horizontally towards the cut line until both a(C)≦a(A) and a(D)≦a(B) hold true, and $x_\mu$ is appropriately adjusted.

Simulations of this implementation have shown several trends with respect to the ACG described herein. For sparse designs, pure quadratic optimization generally outperforms multilevel partitioning, though neither approach is as strong as ACG. Multilevel partitioning performance improves relative to ACG as designs become denser, until the two algorithms practically converge around design densities of 80% and up. For design densities of 50% and above, the quadratic solver results start to degrade considerably. ACG consistently outperforms both methods, improving upon cut-based placement significantly for sparse instances while having little effect on dense instances.

Figure 4:
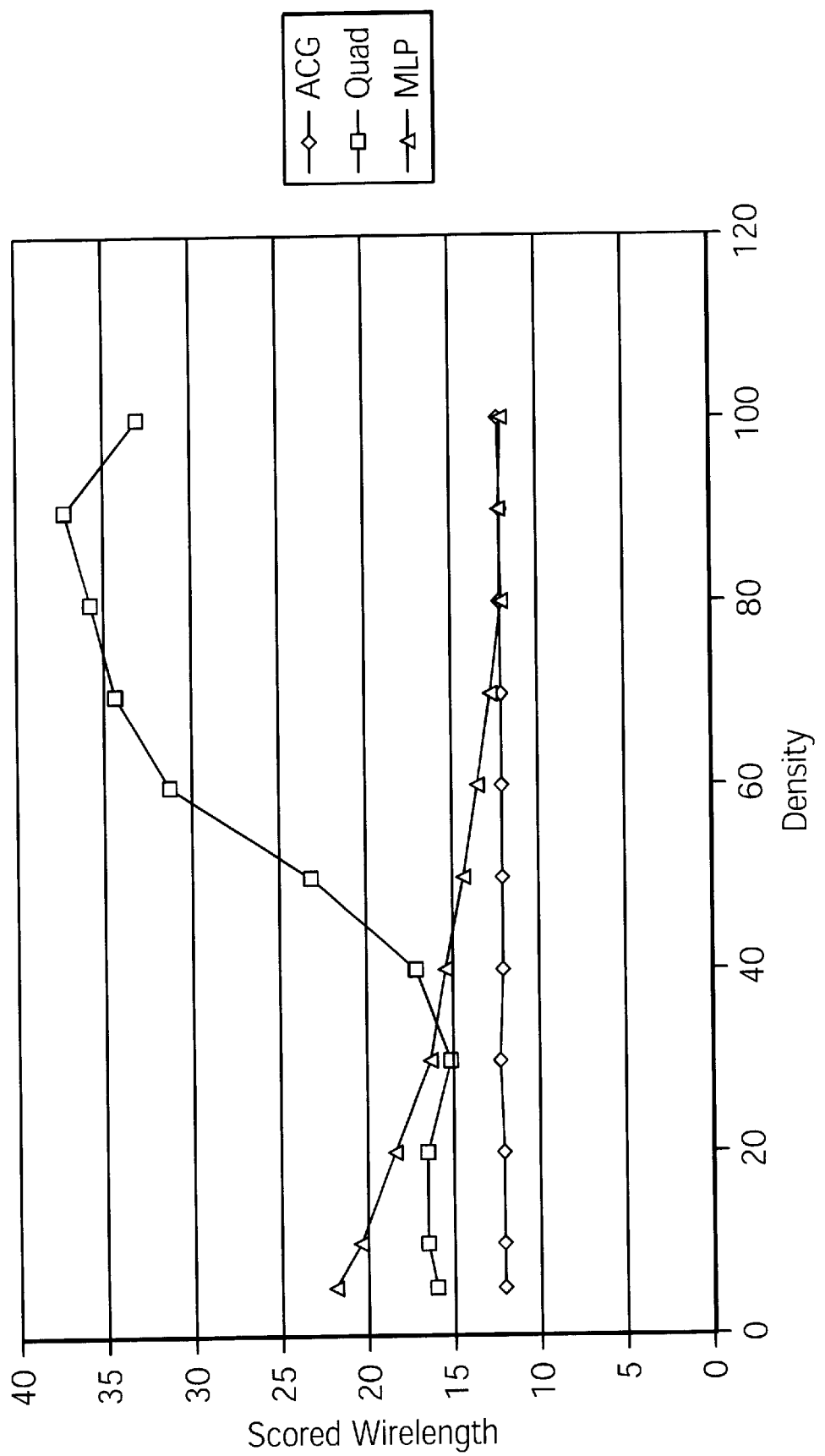
FIG. 4 is a graph depicting scored wirelength values for different placement approaches at different densities.

These trends can be seen in FIG. 4, a graph illustrating a "scored wirelength" value for each of the three approaches, at various densities, based on 12 different circuits. For each design and density, the total wire lengths of the three approaches were compared. The wirelength for a given approach is divided by the smallest wirelength of the three algorithms to yield the score. For example, one integrated circuit with 5% density yielded wire lengths of 1.16, 1.75, and 2.10 for ACG, quadratic optimization, and multilevel partitioning, respectively. Since 1.16 is the smallest wirelength, ACG receives a score of 1.16/1.16=1, quadratic optimization a score of 1.75/1.16=1.51, and multilevel partitioning a score of 2.10/1.16=1.81. Summing these scores over the 12 benchmark circuits results in the values graphed in FIG. 4.

Figure 5:
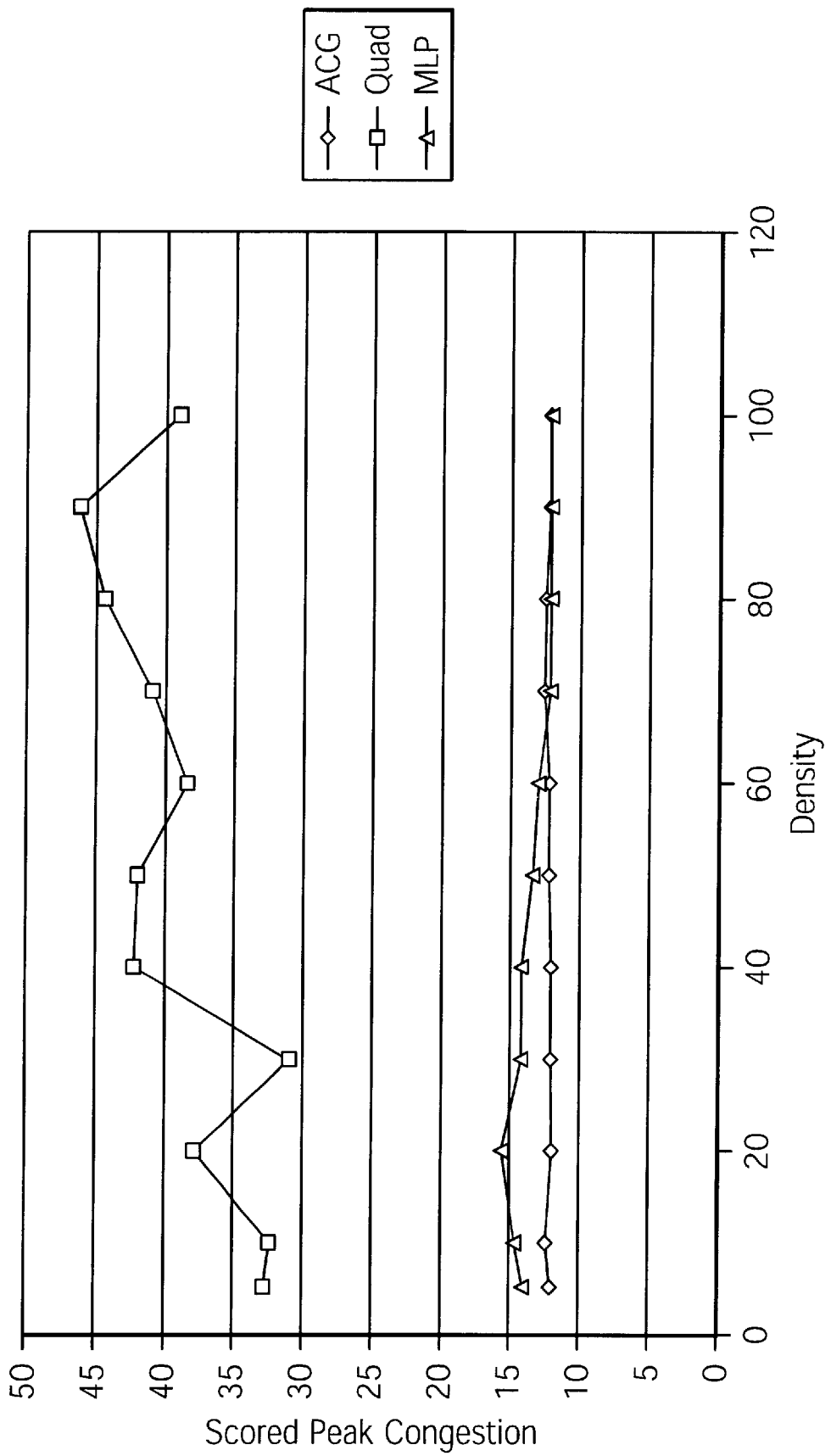
FIG. 5 is a graph depicting scored peak congestion values for different placement approaches at different densities.

The same technique is used to compute peak congestion scores in FIG. 5. One can see that the congestion score for multilevel partitioning converges to the ACG score as density approaches 100%. Also, ACG dominates the other approaches for all density values. ACG has the lowest peak congestion score over the entire range of design densities.

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. It is therefore contemplated that such modifications can be made without departing from the spirit or scope of the present invention as defined in the appended claims.

What is claimed is:

1. A method of designing a layout of an integrated circuit, comprising the steps of:
   deriving at least one cell area analytical constraint for a cut-based placement partitioner using analytical optimization; and
   placing cells on an integrated circuit with the cut-based placement partitioner using the analytical constraint, by assigning a portion of the cells to a given region of a partition based on the analytical constraint.

2. The method of claim 1 where said placing step performs multilevel partitioning.

3. The method of claim 2 wherein said placing step further performs bisection partitioning.

4. The method of claim 1 wherein said deriving step includes the steps of:
   determining an aspect ratio for an entire partitioning region of the integrated circuit; and
   defining a placement rectangle having the same aspect ratio.

5. The method of claim 1 wherein said deriving step includes the steps of:
   determining a center-of-mass coordinate of the cells based on the quadratic optimization; and
   defining a placement rectangle centered on the center-of-mass coordinate.

6. The method of claim 1 wherein said deriving step includes the steps of:
   determining an aspect ratio for an entire partitioning region of the integrated circuit;
   determining a center-of-mass coordinate of the cells based on the quadratic optimization; and
   defining a placement rectangle having the aspect ratio and centered on the center-of-mass coordinate.

7. The method of claim 6 wherein:
   said placement rectangle has a total area equal to a total moveable cell area;
   said deriving step further computes the desired ratio based on a ratio of a first portion of the placement rectangle which lies in the given partition to the total area of the placement rectangle; and
   said placing step places a number of the cells in the given partition based on the desired ratio.

8. A computer system comprising:
   means for processing program instructions;
   a memory device connected to said processing means; and
   program instructions residing in said memory device for designing a layout of an integrated circuit, wherein said program instructions derive at least one cell area analytical constraint for a cut-based placement partitioner using analytical optimization, wherein said program instruction derive the at least one analytical constraint using quadratic optimization to determine a desired ratio of a cell area of a given partition to a total cell area and place cells on an integrated circuit with the cut-based placement partitioner using the analytical constraints, by assigning a portion of the cells to a given region of a partition based on the analvtical constraint.

9. The computer system of claim 8 where said program instructions place the cells using multilevel partitioning.

10. The computer system of claim 9 wherein said program instructions further place the cells using bisection partitioning.

11. The computer system of claim 9 wherein said program instructions further derive the at least one analytical constraint by determining an aspect ratio for an entire partitioning region of the integrated circuit, and defining a placement rectangle having the same aspect ratio.

12. The computer system of claim 9 wherein said program instructions further derive the at least one analytical constraint by determining a center-of-mass coordinate of the cells based on the quadratic optimization, and defining a placement rectangle centered on the center-of-mass coordinate.

13. The computer system of claim 9 wherein said program instructions further derive the at least one analytical constraint by determining an aspect ratio for an entire partitioning region of the integrated circuit, determining a center-of-mass coordinate of the cells based on the quadratic optimization, and defining a placement rectangle having the aspect ratio and centered on the center-of-mass coordinate.

14. The computer system of claim 13 wherein:
   said placement rectangle has a total area equal to a total moveable cell area; and
   said program instructions further compute the desired ratio based on a ratio of a first portion of the placement rectangle which lies in the given partition to the total area of the placement rectangle, and places a number of the cells in the given partition based on the desired ratio.

15. A computer program product comprising:
   a computer-readable medium; and
   program instructions residing in said medium for designing a layout of an integrated circuit, wherein said program instructions derive at least one cell area analytical constraint for a cut-based placement partitioner using analytical optimization, wherein said program instruction derive the at least one analytical constraint using quadratic optimization to determine a desired ratio of a cell area of a given partition to a total cell area and place cells on an integrated circuit with the cut-based placement partitioner using the analytical constraint, by assigning a portion of the cells to a given region of a partition based on the analvtical constraint.

16. The computer program product of claim 15 where said program instructions place the cells using multilevel partitioning.

17. The computer program product of claim 16 wherein said program instructions further place the cells using bisection partitioning.

18. The computer program product of claim 17 wherein said program instructions further derive the at least one analytical constraint by determining an aspect ratio for an entire partitioning region of the integrated circuit, and defining a placement rectangle having the same aspect ratio.

19. The computer program product of claim 17 wherein said program instructions further derive the at least one analytical constraint by determining a center-of-mass coordinate of the cells based on the quadratic optimization, and defining a placement rectangle centered on the center-of-mass coordinate.

20. The computer program product of claim 17 wherein said program instructions further derive the at least one analytical constraint by determining an aspect ratio for an entire partitioning region of the integrated circuit, determining a center-of-mass coordinate of the cells based on the quadratic optimization, and defining a placement rectangle having the aspect ratio and centered on the center-of-mass coordinate.

21. The computer program product of claim 20 wherein:

said placement rectangle has a total area equal to a total moveable cell area; and said program instructions further compute the desired ratio based on a ratio of a first portion of the placement rectangle which lies in the given partition to the total area of the placement rectangle, and places a number of the cells in the given partition based on the desired.

* * * * *

UNITED STATES PATENT AND TRADEMARK OFFICE
CERTIFICATE OF CORRECTION

PATENT NO. : 6,671,867 B2
DATED : December 30, 2003
INVENTOR(S) : Alpert et al.

It is certified that error appears in the above-identified patent and that said Letters Patent is hereby corrected as shown below:

Column 3,
Line 2, change "maybe" to -- may be --

Column 4,
Line 35, change "maybe" to -- may be --

Column 5,
Line 40, change "ad" to -- $a_{ij}$ --
Line 55, delete the hyphen between "the-present"

Column 10,
Line 12, insert -- ratio -- after "desired"

Signed and Sealed this

Twenty-seventh Day of July, 2004

JON W. DUDAS
*Acting Director of the United States Patent and Trademark Office*